United States Patent
Johnson et al.

(10) Patent No.: US 7,763,540 B2
(45) Date of Patent: Jul. 27, 2010

(54) METHOD OF FORMING A SILICIDED GATE UTILIZING A CMP STACK

(75) Inventors: Frank Scott Johnson, Richardson, TX (US); Freidoon Mehrad, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/741,064

(22) Filed: Apr. 27, 2007

(65) Prior Publication Data

US 2008/0268631 A1  Oct. 30, 2008

(51) Int. Cl.
*H01L 21/44* (2006.01)

(52) U.S. Cl. .................. 438/682; 438/649; 438/761; 438/778; 438/791

(58) Field of Classification Search .......... 438/649, 438/682, 761, 778, 791, FOR. 395, FOR. 403
See application file for complete search history.

(56) References Cited

U.S. PATENT DOCUMENTS 6,184,129 B1 * 2/2001 Hwang et al. ............. 438/653
6,960,500 B2 * 11/2005 Shin et al. ................. 438/201
2002/0036347 A1 * 3/2002 Houston .................... 257/758
2007/0037342 A1 * 2/2007 Mehrad et al. ............ 438/230
2008/0233747 A1 * 9/2008 Choi et al. ................. 438/689

* cited by examiner

*Primary Examiner*—N Drew Richards
*Assistant Examiner*—Joannie A Garcia
(74) *Attorney, Agent, or Firm*—Warren L. Franz; Wade J. Brady, III; Frederick J. Telecky, Jr.

(57) ABSTRACT

A method for fabricating a semiconductor device includes forming a silicided gate utilizing a CMP stack. The CMP stack includes a first liner formed over the underlying semiconductor device and a first dielectric layer formed over the first liner layer. The first dielectric layer is formed to approximately the height of the gate. A second liner layer is formed over the first dielectric layer. Since the first dielectric layer is formed to approximately the height of the gate, the second liner over the moat regions is at approximately the height of the first liner over the gate. A CMP process is performed to expose the first liner over the top of the gate. Since the first dielectric layer is formed to the height of the gate, a portion of the second liner remains over the moat regions after the CMP process. Afterwards, the gate is exposed and a silicidation is performed to create a silicided gate.

13 Claims, 3 Drawing Sheets

METHOD OF FORMING A SILICIDED GATE UTILIZING A CMP STACK

FIELD

This invention relates generally to semiconductor fabrication.

BACKGROUND

Currently, metal gate electrodes are being investigated to replace polysilicon gate electrodes in today's ever shrinking and changing semiconductor devices. Traditionally, a polysilicon gate electrode with an overlying silicide was used for the gate electrodes in CMOS devices. However, as device feature size continues to shrink, poly depletion becomes a serious issue when using polysilicon gate electrodes. The polysilicon gate electrodes may be replaced with metal gate electrodes in order to solve problems of polysilicon-depletion effects and boron penetration when forming semiconductor device features.

Recently, silicided metal gates have been utilized in semiconductor device components, such as gates. Typically, in forming silicided gates, polysilicon is deposited over a gate dielectric. Then, a metal is deposited over the polysilicon and reacted to completely consume the polysilicon resulting in a fully silicided metal gate, in lieu of a deposited metal gate. The silicided metal gate provides a metal gate with the least perturbation to the conventional process and avoids contamination issues. Furthermore, polysilicon doping has been shown to affect the work function of the silicided metal gates.

According to the conventional process, the gates and other semiconductor components such as moats must be silicided at the same time. However, for fully silicided gates, the gates and other components cannot be silicided simultaneously because the fully silicided gate will require a different metal or different deposition thickness than other components. As such, processes are needed which allow gates to be silicided separately with minimum added process steps.

SUMMARY OF THE INVENTION

An embodiment of the present disclosure is directed to a method of fabricating a semiconductor device. The method comprises forming a first dielectric layer on a semiconductor device, the semiconductor device comprising a gate, moat regions, and a first liner formed on the gate and moat regions. The first dielectric layer is formed to a thickness of approximately the gate. The method further comprises forming a second liner on the first dielectric layer, forming a second dielectric layer on the second liner, removing the second dielectric layer and a portion of the second liner to expose the first liner on a top of the gate, and removing a portion of the first liner to expose the top of the gate.

Another embodiment is directed to a method of fabricating a semiconductor device. The method comprises forming a dielectric stack over a semiconductor device comprising a gate and moat regions, wherein the dielectric stack comprises a first liner, a first dielectric layer formed over the first liner and to a thickness of approximately the gate, a second liner, and a second dielectric layer; removing a portion of the dielectric stack to expose the first liner positioned over the gate; and removing a portion of the first liner over the gate to expose a top of the gate.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are exemplary and explanatory only and are not restrictive of the invention, as claimed

BRIEF DESCRIPTION OF THE DRAWINGS

The accompanying drawings, which are incorporated in and constitute a part of this specification, illustrate embodiments of the disclosure and together with the description, serve to explain the principles of the embodiments.

DESCRIPTION OF THE EMBODIMENTS

Figure 1:
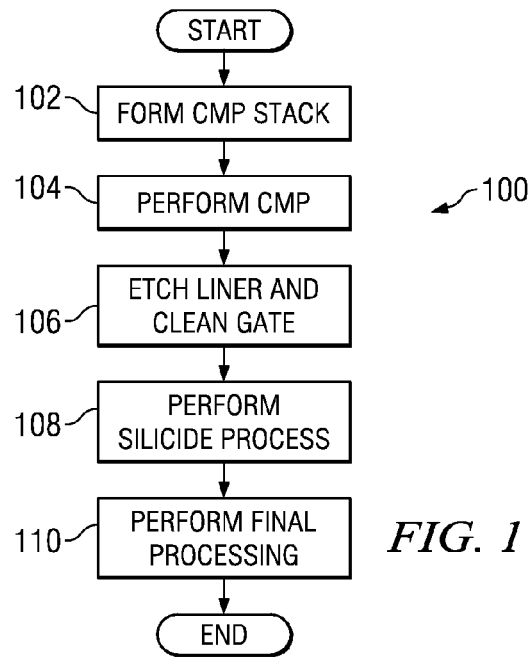
FIG. 1 is a flow diagram illustrating a method for fabricating a semiconductor device consistent with embodiments of the present disclosure.

Embodiments of the present disclosure are directed to a method for fabricating a semiconductor device that includes forming a silicided gate utilizing a chemical mechanical polishing (CMP) stack. In the method, an underlying semiconductor device comprises moat regions, including silicided regions, and a gate. The CMP stack includes a first liner formed over the underlying semiconductor device and a first dielectric layer formed over the first liner layer. The first dielectric layer is formed to approximately the height of the gate. A second liner layer is formed over the first dielectric layer. Since the first dielectric layer is formed to approximately the height of the gate, the second liner over the moat regions is at approximately the height of the first liner over the gate.

A CMP process is performed to expose the first liner over the top of the gate. Since the first dielectric layer is formed to the height of the gate, a portion of the second liner remains over the moat regions after the CMP process. Due to the height of the first liner, second liner, and first dielectric layer, the surface remaining after the CMP process may be flatter then typically achieved during CMP processes.

Afterwards, the gate is exposed and a silicidation is performed to create a silicided gate. Since the gate silicidation is performed separately from forming the moat's silicided regions, the gate may be formed of a different composition silicide with more process control Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments which may be practiced. These embodiments are described in sufficient detail to enable those skilled in the art to practice the embodiments and it is to be understood that other embodiments may be utilized and that changes may be made without departing from the scope of the invention. The following description is, therefore, merely exemplary.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 is a flow diagram illustrating a method 100 for forming fully silicided gates. Method 100 begins with a CMP stack being formed on an underlying semiconductor device (stage 102). Underlying semiconductor device may be any type of well-known semiconductor device that was formed using any type of well-known technique. For example, underlying semiconductor device may be a MOSFET, such as an NMOS, PMOS, CMOS, or other suitable semiconductor device.

Underlying semiconductor device may include moat regions and a gate. The moat regions may include one of a source region, including a source, or a drain region, including a drain. Both the source and the drain may be formed in the source region and the drain region, respectively, using any suitable techniques used in semiconductor processing, such as ion implantation. The moat regions may also include silicided regions formed over the source and drain regions. The silicide regions may be formed by any well-known technique in order to create any type of silicide.

The gate may include a polysilicon portion and a silicide portion. The silicide portion may be formed during the process that forms silicide regions. The gate may include other well-known components such as a gate dielectric, gate sidewalls, and the like.

The CMP stack formed over the dielectric layer comprises a combination of alternating liners and dielectric layers. According to embodiments, the CMP stack comprises a first liner formed over the gate and moat regions, including over the source and drain regions, of the underlying semiconductor device and a first dielectric layer formed over the first liner layer. The first dielectric layer is formed over the moat regions, including over the source and drain regions, to approximately the height of the gate. Thus, the first liner and first dielectric layer are formed to a combined thickness approximately equal to the height of the gate.

Then, a second liner is formed over the first dielectric layer. Since the first dielectric layer is formed to approximately the height of the gate over the source and drain regions, the second liner over the moat regions, including over the source and drain regions, is at approximately the height of the first liner over the gate. The CMP stack may include additional CMP layers formed over the second liner. For example, the CMP stack may include a second dielectric layer.

After the stack is formed, a portion of the stack is removed using a CMP process (stage 104). The CMP process may stop on the first liner over the gate exposing the first liner over the top of the gate. Since over the source and drain regions the first dielectric layer is formed to the height of the gate, the CMP process stops on a portion of the second liner over the moat regions, including over the source and drain regions. As such, a portion of the second liner remains over the moat regions. Due to the height of the first liner, second liner, and first dielectric layer, the surface remaining after the CMP may be flatter than typically achieved during CMP processes.

After a portion of the stack is removed, a portion of the first liner is removed to expose the top of the gate (stage 106). The portion of the first liner may be removed utilizing any well-known technique such as etching. The remaining portion of the second liner may also be removed during the removal of the portion of the first liner.

Then, the silicided portion is removed from the top of the gate to expose the silicon of the gate (stage 107). The silicide may be removed utilizing any type of well-known technique such as cleaning. By removing the silicided portion, the remaining polysilicon portion of the gate may be subjected to a silicidation process.

After the polysilicon of the gate is exposed, a silicidation process is performed to create a silicide in the gate (stage 108). A silicidation process is performed to convert polysilicon of the gate to a silicide. The silicidation process may be any type of well-known silicidation process to from a silicide material. Since the gate silicidation is performed separately from forming the moat's silicided regions, the gate may be formed of a different composition silicide from the moat's silicided regions.

After silicidation, final processing is performed (stage 110). The final process may include forming additional dielectric layers over the underlying semiconductor device. The final processing may also include forming additional semiconductor devices over the underlying semiconductor device.

FIGS. 2A-2F are diagrams illustrating an exemplary method for forming a silicided gate. According to embodiments of the present disclosure, a CMP stack is utilized in forming a silicided gate.

Figure 2A:
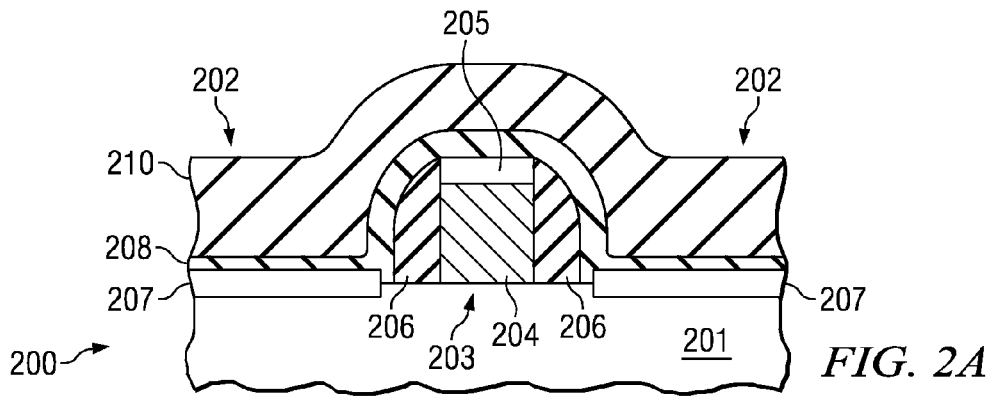
FIGS. 2A-2G are diagrams illustrating a method for fabricating a semiconductor device consistent with embodiments of the present disclosure.

FIG. 2A shows a partially completed MOSFET 200, such as an NMOS, PMOS, CMOS, or other suitable semiconductor device. As illustrated, MOSFET 200 includes a substrate 201, moat regions 202, and a gate 203.

Substrate 201 may be formed from any suitable semiconductor material, such as silicon. For example, substrate 201 may be a silicon wafer, a silicon wafer with previously embedded devices, an epitaxial layer grown on a wafer, a semiconductor on insulation ("SOI") system, or other suitable substrates having any suitable crystal orientation.

Each of moat regions 202 includes one of a source region, including a source, or a drain region, including a drain. Both the source and the drain may be formed in the source region and the drain region, respectively, using any suitable techniques used in semiconductor processing, such as ion implantation.

For example, if MOSFET 200 is a P-type transistor, then boron or other suitable P-type dopant may be implanted during the ion implantation process to form the source and the drain. If MOSFET 200 is an N-type transistor, then arsenic, phosphorous, antimony, or other suitable N-type dopant may be implanted in substrate 201 during the ion implantation process to form the source and the drain. Although not illustrated in FIG. 2A, both the source and the drain may have heavily doped and lightly doped regions. After the ion implantation in the source region and drain region, an anneal process may be performed for diffusion of the dopant. One skilled in the art will realize that this anneal process may be carried out at any suitable temperature for any suitable time period.

Moat regions 202 may also include silicide regions 207 formed over the source and drain regions. Silicide regions 207 may be formed by any well-known technique in order to create any type of silicide. For example, silicide regions 207 may be formed of $CoSi_2$.

Gate 203 may be formed using any suitable growth and/or deposition techniques using semiconductor processing and may be formed from any suitable material, such as polysilicon. For example, gate 203 may include a polysilicon portion 204 and a silicide portion 205. Silicide portion 205 may be formed during the process that forms silicide regions 207. For example, silicide portion 205 may be $CoSi_2$.

A pair of sidewalls 206 may also be formed using any suitable growth and/or deposition techniques using semiconductor processing and may be formed from any suitable dielectric materials, such as oxide, nitride, a combination of oxide and nitride, or other suitable materials. FIG. 2A illustrates a pair of sidewalls but one skilled in the art will realize that gate 203 may include additional sidewalls. Additionally, a gate oxide may be formed between gate 203 and substrate 201.

According to embodiments of the present disclosure, a process for forming a silicide gate may begin with a CMP process including a CMP stack in order to expose the top of gate 203. Once exposed, the gate may be subjected to a silicide process in order to form a silicided gate.

As illustrated in FIG. 2A, a nitride liner 208 is formed over moat regions 202 and gate 203. Nitride liner 208 may be formed of any suitable type of nitride material. For example, nitride liner 208 may be any nitride with a silicon concentration of less than approximately 8%.

Nitride liner 208 may be formed utilizing any suitable method of forming a nitride material. For example, nitride liner 208 may be formed by well-known deposition technique. Nitride liner 208 may be formed to any suitable thickness to provide protection to moat regions 202 and gate 203. For example, nitride liner 208 may be formed to a thickness of approximately 100 Å to 200 Å.

Next, an oxide layer 210 is formed over moat regions 202 and gate 203. Oxide layer 210 may be formed of any suitable type of oxide material. For example, oxide layer 210 may be Tetraethyl Orthosilicate, $Si(OC_2H_5)_4$, ("TEOS") or any other type of well-known deposited oxide.

Oxide layer 210 may be formed utilizing any suitable method to form an oxide material. For example, oxide layer 210 may be formed by any well-known deposition technique. Oxide layer 210 is formed to approximately the height of gate 203 over the moat regions. For example, oxide layer 210 may be formed to a thickness of approximately 800 Å.

Figure 2B:
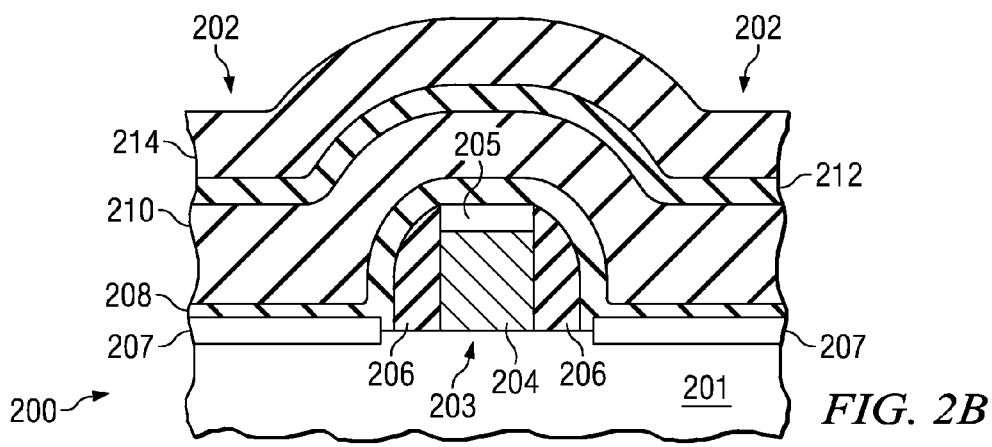

Then, as illustrated in FIG. 2B, a second nitride liner 212 is formed covering oxide layer 210 over moat regions 202 and gate 203. Nitride liner 212 may be formed of any suitable type of nitride material. For example, nitride liner 212 may be a silicon concentration of less than approximately 8%.

Nitride liner 212 may be formed utilizing any suitable method of forming a nitride material. For example, nitride liner 212 may be formed by well-known deposition techniques. Nitride liner 212 may be formed to any suitable thickness to provide a buffer between oxide layer 210 and additional layers. For example, nitride liner 212 may be formed to a thickness of approximately 100 Å to 200 Å. Since oxide layer 210 is formed over the moat regions to approximately the height of the gate, nitride liner 212 over moat regions 202 is at approximately the height of nitride liner 208 over gate 203.

Then, a second oxide layer 214 is formed covering nitride liner 212 over moat regions 202 and gate 203. Oxide layer 214 may be formed of any suitable type of oxide material. For example, oxide layer 214 may be TEOS or any other type of well-known deposited oxide.

Oxide layer 214 may be formed utilizing any suitable method of forming an oxide material. For example, oxide layer 214 may be formed by any well-known deposition technique. Oxide layer 214 is formed to be thicker than oxide 210. For example, oxide layer 214 may be formed to a thickness of approximately 2000 Å to 3000 Å.

Figure 2C:
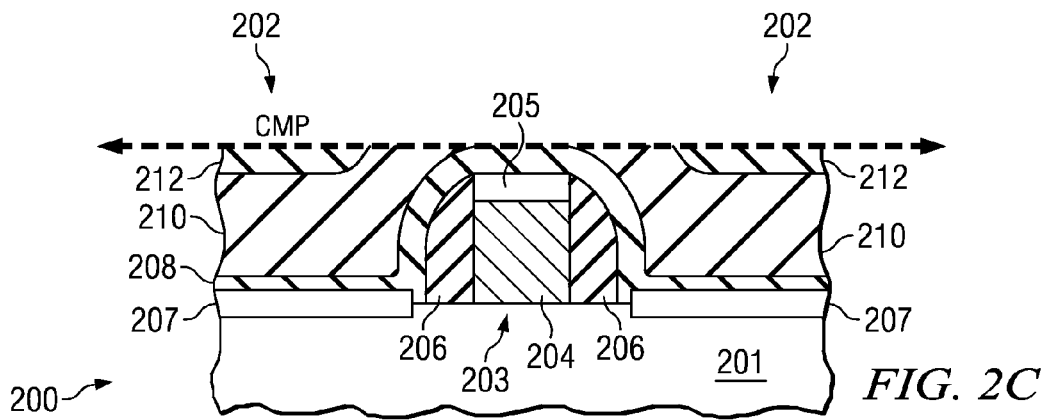

Then, as illustrated in FIG. 2C, a CMP process is performed on MOSFET 200. The CMP process may be performed utilizing any type of well-known CMP apparatus and technique. The chemical mechanical polishing is performed to remove oxide layer 214, a portion of nitride liner 212, and a portion of oxide layer 210. Oxide layer 214, a portion of nitride layer 212, and a portion of oxide layer 210 are removed to expose a portion of nitride liner 208 over gate 203. Since oxide layer 210 is formed to the height of gate 203, a portion of nitride liner 212 remains over moat regions 202.

Figure 2D:
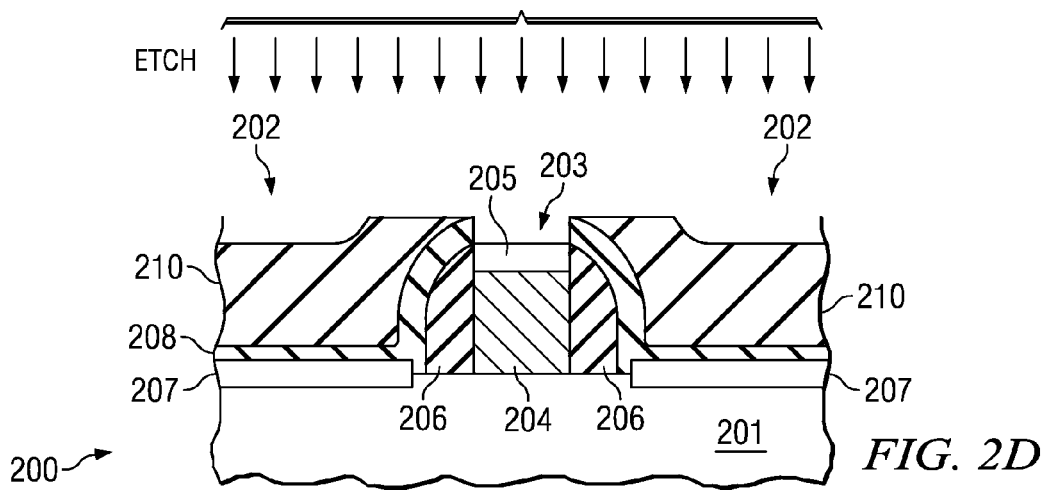

Next, as illustrated in FIG. 2D, an etch is performed to remove a portion of nitride liner 208 over gate 203 to expose the top of gate 203. Additionally, the etch removes the remaining portion of nitride liner 212 over oxide layer 210. The etch may be any type of etch process to remove a nitride material, such as a plasma etch, ion etch, or reactive ion etch.

Figure 2E:
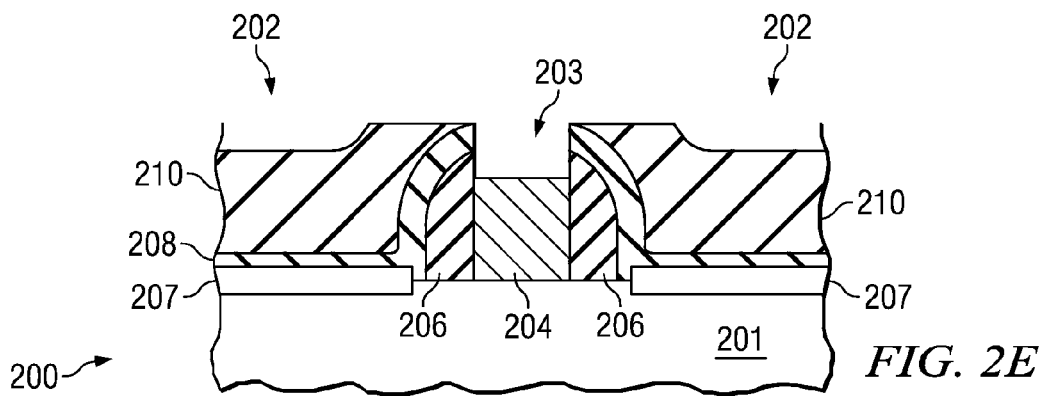

Next, as illustrated in FIG. 2E, a cleaning process is performed to remove silicide portion 205 from gate 203. The cleaning process may be any type of process to remove a silicide material. For example, the cleaning process may be any type of well-known wet or a dry process.

Figure 2F:
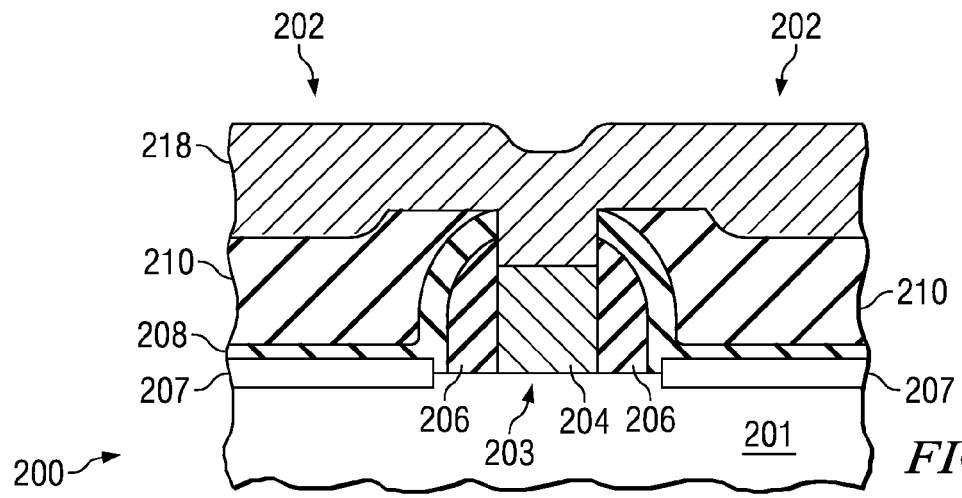
Figure 2G:
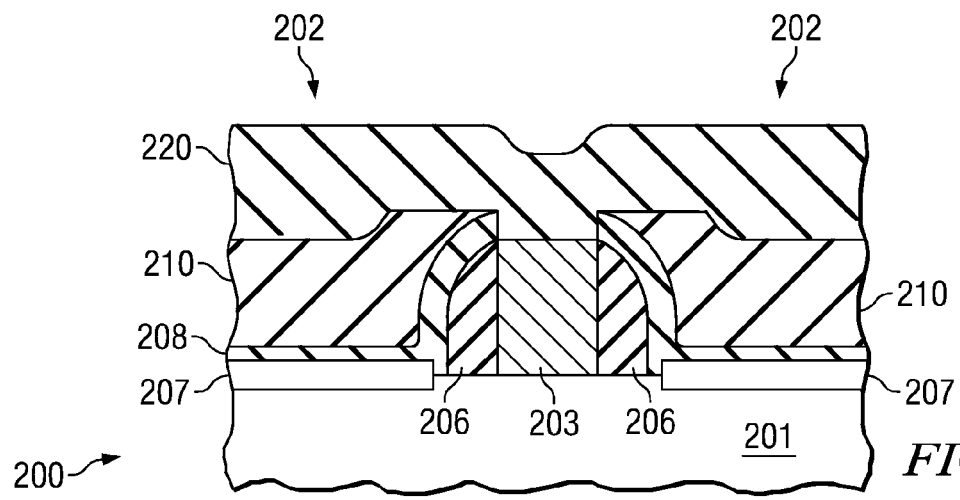

Then, as illustrated in FIG. 2F, a salicide process is performed to convert polysilicon portion 204 of gate 203 to a silicide. The salicide process may be any type of silicidation process, such as a fully silicided (FUSI) process, to form a silicide material. For example, as illustrated, a metal layer 218 may be formed over MOSFET 200. Metal layer 218 may be formed of any type of metal or combination of metals. For example, metal layer may be Co, Ti, Ta, W, Pt, or combination thereof. Metal layer 218 may be formed to a thickness to allow polysilicon portion 204 to be completely converted to a silicide.

To form the silicide, an anneal is performed to convert polysilicon portion 204 of gate 203 to a silicide. The anneal process may be carried out at any suitable temperature for any suitable time period to completely convert polysilicon portion 204 to a silicide. For example, an spike anneal may be performed at a temperature of approximately 400° C. to 600° C.

Then, an oxide layer 220 may be formed over MOSFET 200. Oxide layer 220 may be formed of any suitable type of oxide material and by any suitable deposition technique. For example, oxide layer 220 may be TEOS or any other type of well-known deposited oxide.

Other embodiments of the present teaching will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a semiconductor device, comprising:
    forming a first dielectric layer over a semiconductor device, the semiconductor device comprising a gate, source and drain regions, and a first liner formed on the gate and source and gate regions, wherein the first dielectric layer is formed over the source and drain regions to approximately the height of the gate;
    forming a second liner on the first dielectric layer, the second liner over the source and drain regions being at approximately the same height as the height over the gate of the first liner;
    forming a second dielectric layer on the second liner;
    using chemical mechanical polishing, removing the second dielectric layer and a portion over the gate of the second liner to expose the first liner over the gate, leaving at least a portion of the second liner over the source and drain regions;

using etching, removing a portion of the first liner exposed over the gate to expose a top of the gate;

with the source and drain regions still covered by portions of the first liner and first dielectric layer, performing a gate silicidation process.

2. The method of claim 1, wherein the gate silicidation process is a fully silicided (FUSI) gate silicidation process.

3. The method of claim 1, wherein the first and second liners comprise first and second nitride layers; and the first and second dielectric layers comprise first and second oxide layers.

4. The method of claim 1, wherein the first and second liners are formed to a thickness in a range of approximately 100 Å to approximately 200 Å.

5. The method of claim 4, wherein the first dielectric layer is formed to a thickness of approximately 800 Å.

6. The method of claim 5, wherein the second dielectric layer is formed to a thickness in a range of approximately 2000 Å to approximately 3000 Å.

7. The method of claim 1, wherein the semiconductor device over which the first dielectric layer further includes silicided regions formed over the source and drain regions.

8. The method of claim 7, wherein the gate silicidation process forms a silicided gate having a different composition silicide from the silicided regions formed over the source and drain regions.

9. The method of claim 7, wherein the gate of the semiconductor device over which the first dielectric layer is formed includes a polysilicon portion and a silicide portion; and the method further comprises removing the silicide portion from the gate after using etching to expose the top of the gate and before performing the silicidation process.

10. The method of claim 1, wherein the etching to remove the portion of the first liner over the gate also removes a remaining portion of the second liner.

11. The method of claim 1, wherein the first and second dielectric layers comprise first and second oxide layers; and the first and second liner layers comprise first and second nitride layers.

12. A method of fabricating a semiconductor device, comprising:

forming a dielectric stack over a semiconductor device comprising a gate and source and drain regions, wherein the dielectric stack comprises a first liner, a first dielectric layer formed over the first liner, a second liner formed over the first dielectric layer, and a second dielectric layer formed over the second liner, and wherein the first liner and first dielectric layer are formed to a combined thickness approximately equal to the height of the gate, so that the height of the second liner over the source and drain regions is at approximately the height of the first liner over the gate;

planarizing the dielectric stack down to the second liner over the source and drain regions to expose the first liner over the gate;

removing a portion of the first liner over the gate to expose a top of the gate, leaving portions of the first liner and first dielectric layer remaining over the source and drain regions; and with the source and drain regions covered by the remaining portions of the first liner and first dielectric layer, performing a silicidation process to form a silicided gate.

13. A method of fabricating a semiconductor device, comprising:

forming a gate over a semiconductor substrate, the gate including a polysilicon portion over a gate dielectric portion;

forming sidewalls on sides of the gate;

forming source and drain regions by implanting dopant into moat regions of the substrate adjacent the sidewalls;

forming silicide regions over the source and drain regions and over the polysilicon portion of the gate;

forming a first nitride liner over the silicide regions and over the gate;

forming a first oxide layer over the first nitride liner over the silicide regions and over the gate, the oxide liner being formed over the silicide regions to approximately the height of the gate;

forming a second nitride liner over the first oxide layer over the silicide regions and over the gate, the second nitride liner being formed over the first oxide layer at approximately the height of the first liner over the gate;

forming a second oxide layer over the second nitride liner over the silicide regions and over the gate;

performing a chemical mechanical polishing to remove the second oxide layer, a portion of the second nitride liner over the gate and a portion of the first oxide layer over the gate, to expose a portion of the first nitride liner over the gate, leaving portions of the first oxide layer and the first nitride liner remaining over the silicide regions;

performing an etch to remove the exposed portion of the first nitride liner over the gate, to expose a portion of the polysilicon portion of the gate; and performing a silicidation process on the exposed portion of the polysilicon portion of the gate.

* * * * *